US008010586B2

(12) United States Patent  
Shin

(10) Patent No.: US 8,010,586 B2  
(45) Date of Patent: Aug. 30, 2011

(54) APPARATUS AND METHOD OF GENERATING DBI SIGNAL IN SEMICONDUCTOR INTEGRATED CIRCUIT

(75) Inventor: Beom-Ju Shin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 1074 days.

(21) Appl. No.: 11/878,091

(22) Filed: Jul. 20, 2007

(65) Prior Publication Data

US 2008/0136462 A1 Jun. 12, 2008

(30) Foreign Application Priority Data

Dec. 7, 2006 (KR) .......................... 10-2006-0123574

(51) Int. Cl.
*G06F 15/00* (2006.01)

(52) U.S. Cl. ...................................................... 708/210
(58) Field of Classification Search .................. 708/210, 708/708

See application file for complete search history.

(56) References Cited

U.S. PATENT DOCUMENTS

| 6,665,691 | B2* | 12/2003 | Hossain | 708/200 |
| 7,139,852 | B2 | 11/2006 | LaBerge | |
| 2002/0073127 | A1* | 6/2002 | Hossain | 708/210 |
| 2002/0095450 | A1* | 7/2002 | Karim et al. | 708/210 |
| 2002/0121918 | A1 | 9/2002 | Alani et al. | |
| 2005/0216630 | A1 | 9/2005 | Gaskins et al. | |
| 2007/0115733 | A1 | 5/2007 | Jang et al. | |

FOREIGN PATENT DOCUMENTS

KR 100578219 5/2006

* cited by examiner

*Primary Examiner* — Chuong D Ngo
(74) *Attorney, Agent, or Firm* — Venable LLP; Jeffri A. Kaminski

(57) ABSTRACT

An apparatus for generating a DBI signal in a semiconductor integrated circuit includes a full adder that includes data input terminals and a carry input terminal, each of which receives data, performs an operation on the received data, thereby outputting a sum and a carry. A half adder includes data input terminals, each of which receives data, performs an operation on the received data, thereby outputting a sum and a carry. A DBI determining unit determines a logic value of each of the data according to the sums and the carries that are transmitted from the full adder and the half adder, thereby outputting a DBI signal.

14 Claims, 3 Drawing Sheets

//H1: APPARATUS AND METHOD OF GENERATING DBI SIGNAL IN SEMICONDUCTOR INTEGRATED CIRCUIT

APPARATUS AND METHOD OF GENERATING DBI SIGNAL IN SEMICONDUCTOR INTEGRATED CIRCUIT

CROSS-REFERENCE TO RELATED PATENT APPLICATION

This application claims the benefit of Korean Patent Application No. 10-2006-0123574, filed on Dec. 7, 2006, in the Korean Intellectual Property Office, the disclosure of which is incorporated herein in its entirety by reference.

BACKGROUND OF THE INVENTION

1. Technical Field

Embodiments of the present invention relates to an apparatus and method of generating a data bus inversion (DBI) signal in a semiconductor integrated circuit, and more particularly, to an apparatus and method of generating a DBI signal in a semiconductor integrated circuit that increases an area margin.

2. Related Art

In general, semiconductor integrated circuits, such as semiconductor memory apparatuses, output data in multiples of 2 (for example, 128 and 256 data). To this end, the semiconductor integrated circuit includes many data output buffers, and drives data transmitted through global lines. Each of the data output buffers includes an MOS transistor. Each of the MOS transistors drives the data according to the level of each of the data and outputs the driven data to the outside of a chip.

The state of each of the MOS transistors constituting the data output buffers is determined according to a logic value of the data. For example, when data at a high level is transmitted to the data output buffer, which is composed of an NMOS transistor, the NMOS transistor is turned on, such that current flows between a drain terminal and a source terminal of the NMOS transistor. As the number of MOS transistors increases, the current that flows among the plurality of MOS transistors included in the plurality of data output buffers increases, the semiconductor integrated circuit has a high current loss, and thus, power efficiency is reduced.

In order to solve the above-described current loss, a data bus inversion (DBI) technique is introduced into the semiconductor integrated circuit according to the related art. According to the DBI technique, it is determined how many data generate current for transistors of data output buffers among a predetermined number of data (for example, 8 data). When it is determined that a lot of data generates current, the data is inverted to thereby reduce the current loss. For example, when NMOS transistors are included in data output buffers, the semiconductor integrated circuit does not invert the data when among the eight data, less than 5 data are at a high level, but transmits the data to the data output buffers. On the other hand, the semiconductor integrated circuit inverts the data when among the eight data, five or more data are at a high level, and transmits the data to the data output buffers.

In order to perform the above-described operation, the semiconductor integrated circuit includes an apparatus for generating a DBI signal. As described above, the apparatus for generating a DBI signal determines the number of data that generate current, and generates a DBI signal. That is, when the DBI signal is enabled, a DBI control unit inverts the data that is transmitted to each of the data output buffers. On the other hand, when the DBI signal is disabled, the DBI control unit does not invert the data that is transmitted to each of the data output buffers. The DBI technique is applied to semiconductor integrated circuits, such as graphic processing units (GPUs), as well as to semiconductor memory apparatuses. The DBI technique can be implemented in general semiconductor integrated circuits that target low power consumption.

Hereinafter, an apparatus for generating a DBI signal according to the related art will be described as follows with reference to FIG. 1.

FIG. 1 is a block diagram showing the structure of an apparatus for generating a DBI signal in a semiconductor integrated circuit according to the related art. In FIG. 1, the apparatus for generating a DBI signal generates a DBI signal DBI_flag from eight data GIO<1:8> transmitted through global lines.

As shown in FIG. 1, the apparatus for generating a DBI signal includes four 2-input counters 2, two 6-input counters 4, and one 8-input counter 6. Each of the 2-input counters 2 receives two data among the eight data GIO<1:8> that are transmitted through the global input/output lines. Each of the 2-input counters 2 determines how many data are at a high level, that is, how many data have a logic value of '1' between the two data, and enables a first 0-number determination signal dtng1<0>, a first 1-number determination signal dtng1<1>, or a first 2-number determination signal dtng1<2>. Then, using the two first 0-number determination signals dtng1<0>, the two first 1-number determination signals dtng1<1>, and the two first 2-number determination signals dtng1<2> that are transmitted from the two 2-input counters 2 among the four 2-input counters 2, each of the 6-input counters 4 determines how many data have the logic value of '1' among the four data, and determines whether or not to enable a second 0-number determination signal dtng2<0>, a second 2-number determination signal dtng2<2>, a second 3-number determination signal dtng2<3>, and a second 4-number determination signal dtng2<4>. At this time, when among the four data, one data has a logic value of '1', all of the second 0-number determination signal dtng2<0>, the second 2-number determination signal dtng2<2>, the second 3-number determination signal dtng2<3>, and the second 4-number determination signal dtng2<4> are disabled.

Then, using the two second 0-number determination signals dtng2<0>, the two second 2-number determination signals dtng2<2>, the two second 3-number determination signals dtng2<3>, and the two second 4-number determination signals dtng2<4> that are transmitted from the two 6-input counters 4, the 8-input counter 6 determines how many data have the logic value of '1' among the eight data, and determines whether or not to enable the DBI signal DBI_flag. That is, the 8-input counter 6 enables the DBI signal DBI_flag when among the eight data, five or more data have the logic value of '1', and disables the DBI signal DBI_flag when less than five data have the logic value of '1' among the eight data.

As described above, since the apparatus for generating a DBI signal according to the related art includes the seven counters in order to perform an operation process including three steps, the area of the apparatus for generating a DBI signal is not small. Further, since the signal output lines of each of the 2-input counters are 1.5 times as many as the signal input lines, an improvement in integration of the apparatus for generating a DBI signal is limited. That is, the structure of the apparatus for generating a DBI signal according to the related art makes it difficult to increase an area margin.

SUMMARY OF THE INVENTION

Embodiments of the present invention provide an apparatus and method of generating a DBI signal in a semiconductor integrated circuit that may increase an area margin and realize a high degree of integration.

An embodiment of the present invention provides an apparatus for generating a data bus inversion (DBI) signal in a semiconductor integrated circuit that may include: a full adder that may be configured to include data input terminals and a carry input terminal, each of which may receive data and to perform an operation on the received data, thereby outputting a sum and a carry; a half adder that may be configured to include data input terminals, each of which may receive data and to perform an operation on the received data, thereby outputting a sum and a carry; and a DBI determining unit that may be configured to determine a logic value of each of the data according to the sums and the carries that are transmitted from the full adder and the half adder, thereby generating a DBI signal.

Another embodiment of the present invention may provide an apparatus for generating a data bus inversion (DBI) signal in a semiconductor integrated circuit that may include: first and second full adders each of which may include two data input terminals and one carry input terminal, each may receive data and adds the received data, thereby outputting a sum and a carry; a half adder that may be configured to include two data input terminals, each of which may receive data and to add the received data, thereby outputting a sum and a carry; and a DBI determining unit that may be configured to receive the sums and the carries, which are transmitted from the first and second full adders and the half adder, and to generate a DBI signal that is enabled when the number of data having a first logic value exceeds half the number of data that are input to the first and second full adders and the half adder.

Still another embodiment of the present invention may provide a method of generating a data bus inversion (DBI) signal in a semiconductor integrated circuit that may include: generating a sum and a carry by inputting data to data input terminals and a carry input terminal of a full adder, and generating a sum and a carry by inputting data to data input terminals of a full adder; and determining a logic value of the data on the basis of the sums and the carries that are generated by the full adder and the half adder, thereby generating a DBI signal.

Yet another embodiment of the present invention may provide a method of generating a DBI signal in a semiconductor integrated circuit that may include: generating sums and carries by inputting data to two data input terminals and one carry input terminal that are included in each of the first and second full adders, and generating a sum and a carry by inputting data to two data input terminals of a half adder; and receiving the sums and the carries that are generated by the first and second full adders and the half adder, and generating a DBI signal that is enabled when the number of data having a first logic value exceeds half the number of data that are input to the first and second full adders and the half adder.

DESCRIPTION OF EXEMPLARY EMBODIMENT

An exemplary embodiment of the present invention will now be described in detail with reference to the accompanying drawings.

Figure 1:
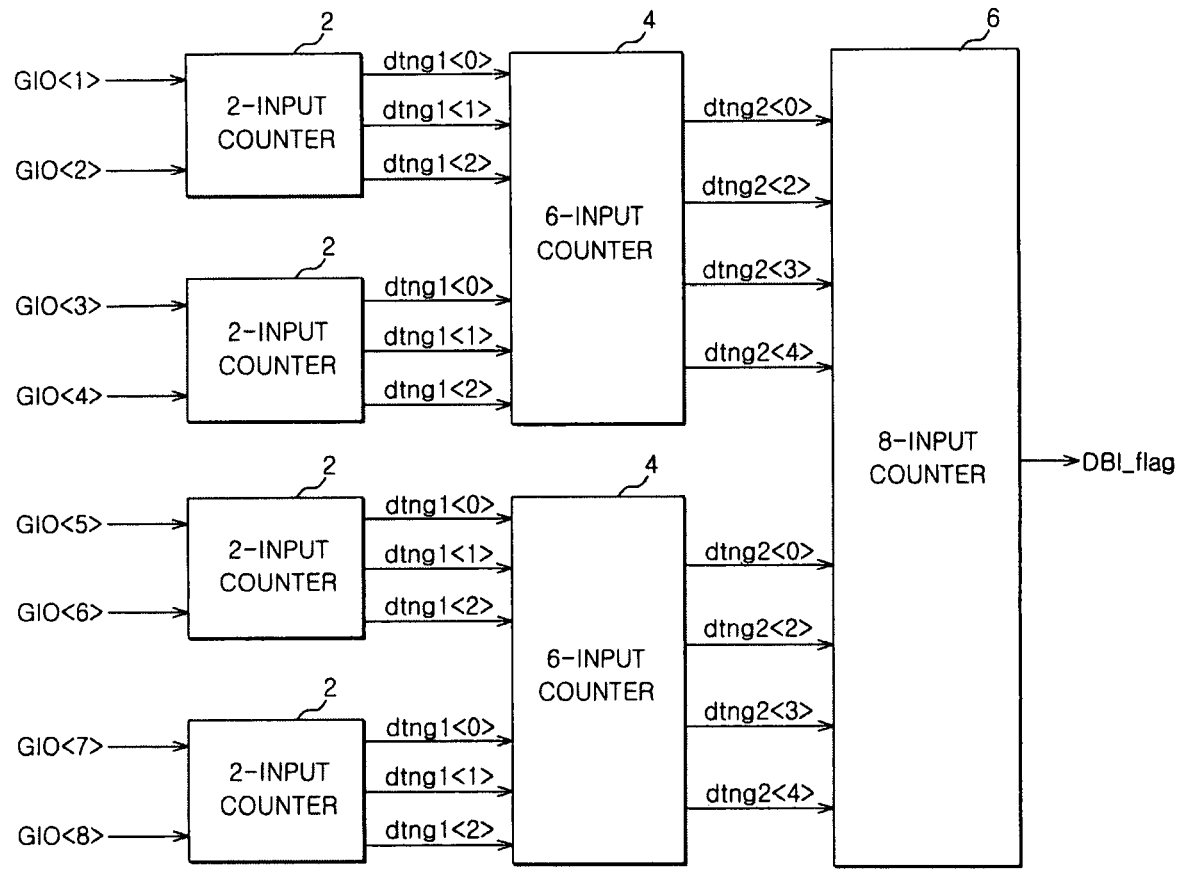
FIG. 1 is a block diagram showing the structure of an apparatus for generating a DBI signal in a semiconductor integrated circuit according to the related art.
Figure 2:
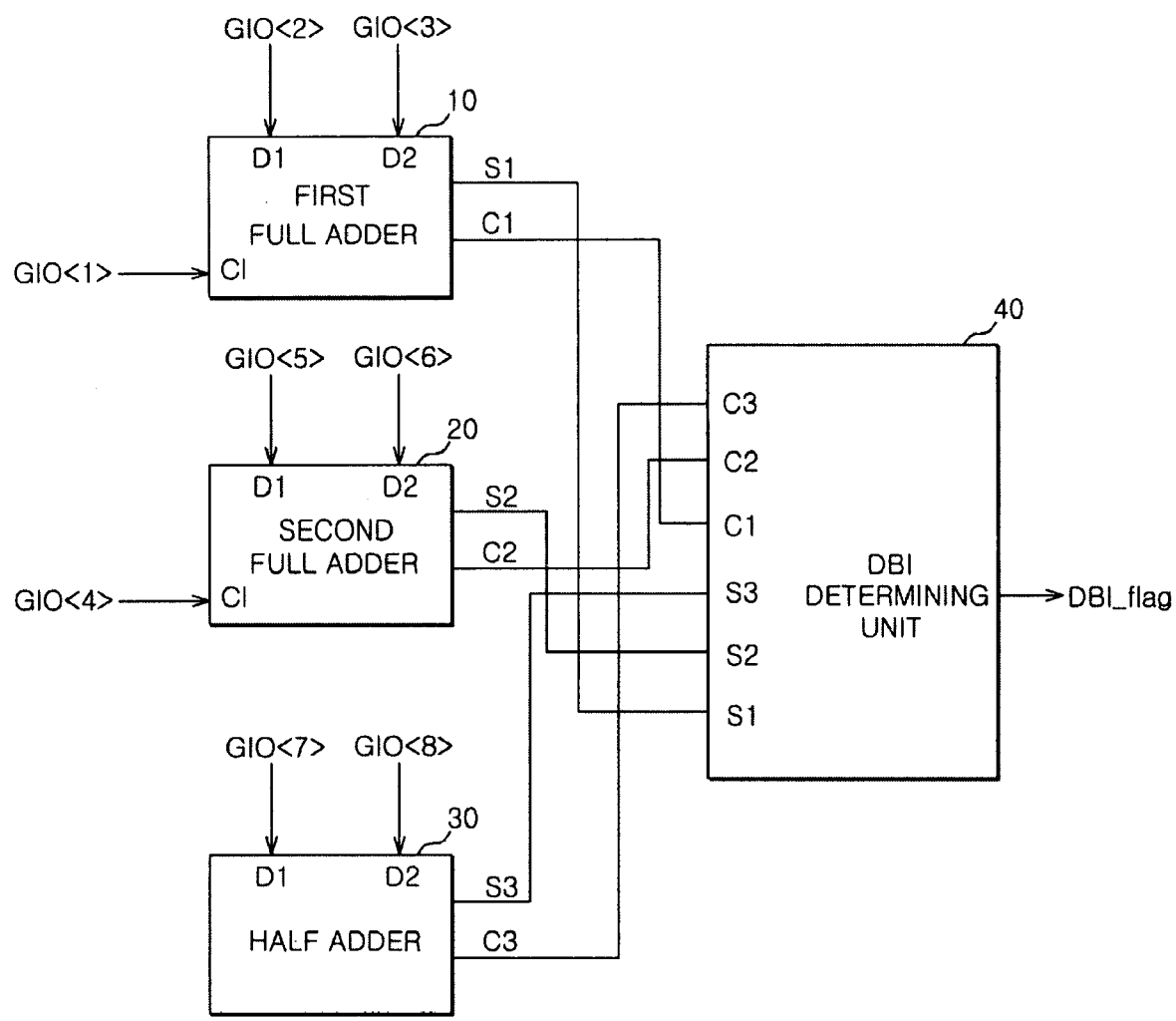
FIG. 2 is a block diagram showing the structure of an apparatus for generating a DBI signal in a semiconductor integrated circuit according to an embodiment of the present invention.

FIG. 2 is a block diagram showing an example of the structure of an apparatus for generating a DBI signal in a semiconductor integrated circuit according to an embodiment of the present invention. In FIG. 2, the apparatus for generating a DBI signal may generate a DBI signal DBI_flag from eight data GIO<1:8> that are transmitted through global lines.

As shown in FIG. 2, the exemplary apparatus for generating a DBI signal may include a first full adder 10, a second full adder 20, a half adder 30, and a DBI determining unit 40.

The first full adder 10 may include a carry input terminal CI receiving data 1 (GIO<1>), a first data input terminal D1 receiving data 2 (GIO<2>), and a second data input terminal D2 receiving data 3 (GIO<3>). The first full adder 10 may add the received data to each other, and outputs a sum 1 (S1) and a carry 1 (C1).

The second full adder 20 may include a carry input terminal CI receiving data 4 (GIO<4>), a first data input terminal D1 receiving data 5 (GIO<5>), and a second data input terminal D2 receiving data 6 (GIO<6>). The second full adder 20 may add the received data to each other, and outputs a sum 2 (S2) and a carry 2 (C2).

The half adder 30 may include a first data input terminal D1 receiving data 7 (GIO<7>) and a second data input terminal D2 receiving data 8 (GIO<8>), add the received data, and output a sum 3 (S3) and a carry 3 (C3).

Each of the first and second full adders 10 and 20 adds the three data to each other, and the half adder 30 adds the two data to each other. The sum 3 (S3) and the carry 3 (C3) that are output from the half adder 30 cannot have a logic value of '1' at the same time.

The DBI determining unit 40 may receive the sum 1 (S1), the sum 2 (S2), the sum 3 (S3), the carry 1 (C1), the carry 2 (C2), and the carry 3 (C3), determine how many data have a logic value of '1' among the data 1 to 8 GIO<1:8>, and generate the DBI signal DBI_flag. The DBI determining unit 40 may enable the DBI signal DBI_flag when, for example, five or more data have the logic value of '1', and disable the DBI signal DBI_flag when, for example, less than five data have the logic value of '1'.

In an exemplary embodiment, the DBI determining unit 40 may determine how many data among the eight data GIO<1:8> have a logic value of '1' according to the following exemplary logic.

When each of the carry 1 (C1), the carry 2 (C2), and the carry 3 (C3) has the logic value of '1', at least six data among the eight data GIO<1:8> have logic values of '1'. Therefore, the DBI signal DBI_flag is enabled.

This may be represented by the following equation:

$$\text{DBI signal DBI\_flag} = C1 * C2 * C3$$

If any two of the carry 1 (C1), the carry 2 (C2), and the carry 3 (C3) have logic values of '1', when at least one of the sum 1 (S1), the sum 2 (S2), and the sum 3 (S3) has a logic value of '1', the DBI signal DBI_flag is enabled. At this time, it should be considered that the sum 3 (S3) and the carry 3 (C3) do not have the logic value of '1' at the same time.

This may be represented by the following equation:

$$DBI\ signal\ DBI\_flag = C1*C2*(S1+S2+S3)+C1*C3*\\(S1+S2)+C2*C3*(S1+S2)=C1*C2*S3+(C1*C2+\\C2*C3+C1*C3)*(S1+S2)$$

If the carry 1 (C1) or the carry 2 (C2) has a logic value of '1' and each of the sum 1 (S1), the sum 2 (S2), and the sum 3 (S3) has a logic value of '1', the DBI signal DBI_flag is enabled. In this case, the carry 3 (C3) and the sum 3 (S3) do not have the logic values of '1' at the same time. Therefore, when only the carry 3 (C3) has the logic value of '1', the DBI signal DBI_flag is not enabled.

This may be represented by the following equation:

$$DBI\ signal\ DBI\_flag = C1*S1*S2*S3+C2*S1*S2*S3=\\(C1+C2)*S1*S2*S3$$

A case in which the DBI signal DBI_flag is enabled according to the above-described logic may be represented by the following equation:

$$DBI\ signal\ DBI\_flag = C1*C2*C3+C1*C2*S3+\\(C1*C2+C2*C3+C1*C3)*(S1+S2)+(C1+C2)\\*S1*S2*S3$$

The DBI determining unit 40 may be configured according to the equation that generates the DBI signal DBI_flag. The structure of the exemplary DBI determining unit 40 is shown in FIG. 3.

Figure 3:
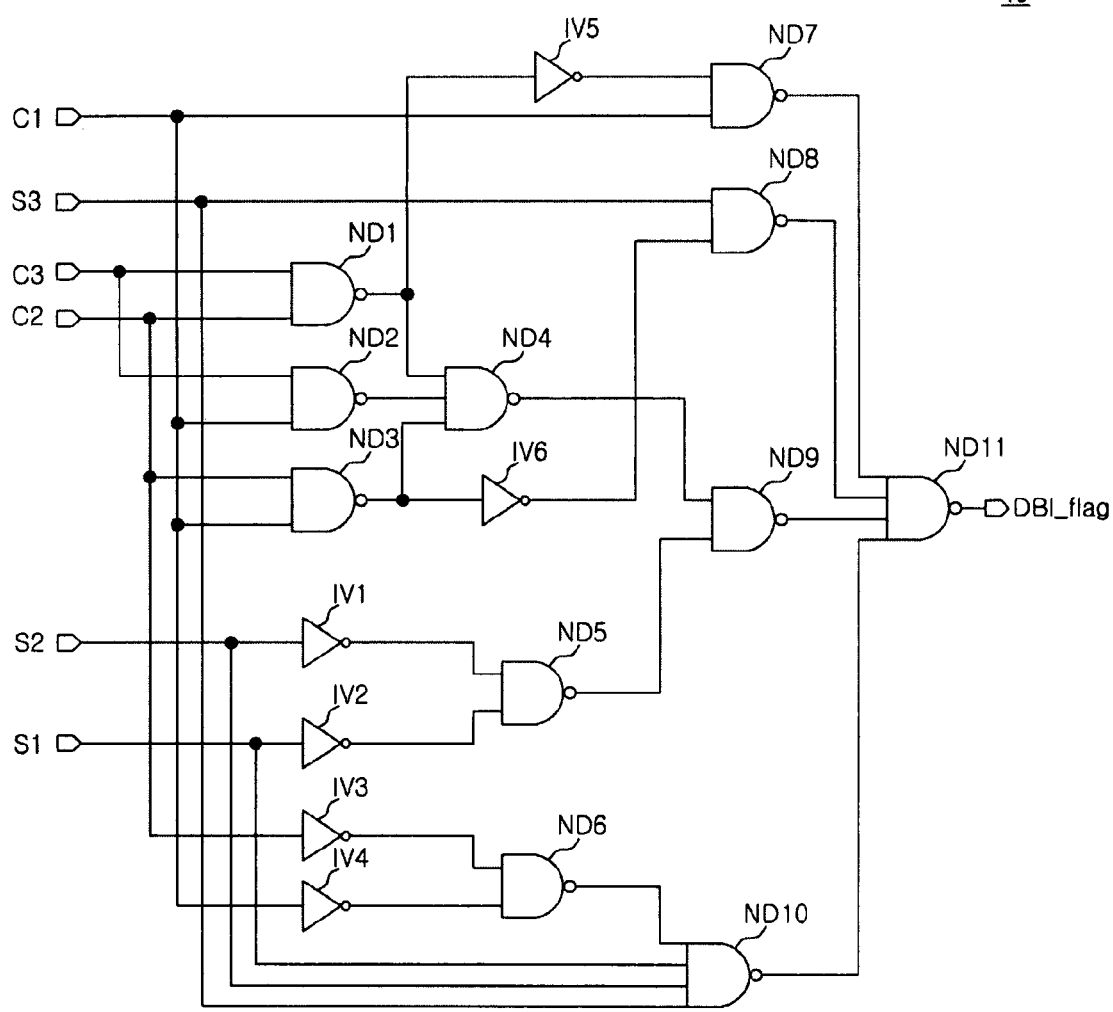
FIG. 3 is a circuit diagram showing an example of the detailed structure of a DBI determining unit shown in FIG. 2.

Referring FIG. 3, the DBI determining unit 40 may include first to eleventh NAND gates ND1 to ND11 and first to sixth inverters IV1 to IV6.

The first NAND gate ND1 receives the carry 2 (C2) and the carry 3 (C3).

The second NAND gate ND2 receives the carry 1 (C1 and the carry 3 (C3).

The third NAND gate ND3 receives the carry 1 (C1) and the carry 2 (C2).

The first inverter IV1 receives the sum 2 (S2).

The second inverter IV2 receives the sum 1 (S1).

The third inverter IV3 receives the carry 2 (C2).

The fourth inverter IV4 receives the carry 1 (C1).

The fifth inverter IV5 receives an output signal of the first NAND gate ND1.

The fourth NAND gate ND4 receives output signals of the first, second, and third NAND gates ND1, ND2, and ND3.

The sixth inverter IV6 receives an output signal of the third NAND gate ND3.

The fifth NAND gate ND5 receives output signals of the first and second inverters IV1 and IV2.

The sixth NAND gate ND6 receives output signals of the third and fourth inverters IV3 and IV4.

The seventh NAND gate ND7 receives an output signal of the fifth inverter IV5 and the carry 1 (C1).

The eighth NAND gate ND8 receives the sum 3 (S3) and an output signal of the sixth inverter IV6.

The ninth NAND gate ND9 receives output signals of the fourth and fifth NAND gates ND4 and ND5.

The tenth NAND gate ND10 receives an output signal of the sixth NAND gate ND6, the sum 1 (S1), the sum 2 (S2), and the sum 3 (S3).

The eleventh NAND gate ND11 receives output signals of the seventh, eighth, ninth, and tenth NAND gates ND7, ND8, ND9, and ND10, and outputs the DBI signal DBI_flag.

In the DBI determining unit 40 having the above-described structure, when each of the carry 1 (C1), the carry 2 (C2), and the carry 3 (C3) has a logic value of '1', the output signal of the first NAND gate ND1 becomes a low level, and the output signal of the fifth inverter IV5 becomes a high level. Therefore, the output signal of the seventh NAND gate ND7 becomes a low level. Accordingly, the eleventh NAND gate ND11 outputs the DBI signal DBI_flag at a high level, that is, the enabled DBI signal DBI_flag, in response to the input of the signal at the low level.

When each of the carry 1 (C1), the carry 2 (C2), and the sum 3 (S3) has the logic value of '1', the DBI signal DBI_flag is enabled. In this case, the third NAND gate ND3 outputs a signal at a low level, and the sixth inverter IV6 inverts the signal at the low level. The eighth NAND gate ND8 receives signals at a high level, and outputs a signal at a low level. The eleventh NAND gate ND11 outputs the DBI signal DBI_flag at the high level.

When each of the carry 1 (C1) and the carry 2 (C2) has the logic value of '1' and the sum 1 (S1) or the sum 2 (S2) has a logic value of '1', the DBI signal DBI_flag is enabled. In this case, the output signal of the third NAND gate ND3 becomes a low level, the output signal of the fourth NAND gate ND4 becomes a high level, and the output signal of the fifth NAND gate ND5 becomes a high level. Therefore, the output signal of the ninth NAND gate ND9 becomes a low level, and the eleventh NAND gate ND11 outputs the DBI signal DBI_flag at the high level.

When each of the carry 2 (C2) and the carry 3 (C3) has a logic value of '1' and the sum 1 (S1) or the sum 2 (S2) has a logic value of '1', the DBI signal DBI_flag is enabled. In this case, the output signal of the first NAND gate ND1 becomes a low level, the output signal of the fourth NAND gate ND4 becomes a high level, and the output signal of the fifth NAND gate ND5 becomes a high level. Therefore, the output signal of the NAND gate ND9 becomes a low level, and the eleventh NAND gate ND11 outputs the DBI signal DBI_flag at the high level.

When each of the carry 1 (C1) and the carry 3 (C3) has a logic value of '1' and the sum 1 (S1) or the sum 2 (S2) has a logic value of '1', the DBI signal DBI_flag is enabled. In this case, the output signal of the second NAND gate ND2 becomes a low level, the output signal of the fourth NAND gate ND4 becomes a high level, and the output signal of the fifth NAND gate ND5 becomes a high level. The output signal of the ninth NAND gate ND9 becomes a low level, and the eleventh NAND gate ND11 outputs the DBI signal DBI_flag at the high level.

When each of the sum 1 (S1), the sum 2 (S2), and the sum 3 (S3) has the logic value of '1', and the carry 1 (C1) or the carry 2 (C2) has the logic value of '1', the DBI signal DBI_flag is enabled. In this case, the output signal of the sixth NAND gate ND6 becomes a high level, and the tenth NAND gate ND10 receives four signals at the high level and outputs a signal at a low level. Then, the eleventh NAND gate ND11 outputs the DBI signal DBI_flag at the high level.

In cases other than those described above, it will be easily understood from the above-described circuit configuration that each of the seventh to tenth NAND gates ND7 to ND10 becomes a high level and then the eleventh NAND gate ND11 outputs the DBI signal DBI_flag at a low level.

That is, the DBI determining unit 40, which is configured according to the above-described equations, determines whether among the eight data GIO<1:8>, for example, five or more data have a logic value of '1' on the basis of the sum 1 (S1), the sum 2 (S2), the sum 3 (S3), the carry 1 (C1), the carry 2 (C2), and the carry 3 (C3), and determines whether or not to enable the DBI signal DBI_flag.

As such, the occupied area of the apparatus for generating a DBI signal, which may include the two full adders 10 and 20, one half adder 30, and the above-described DBI determining unit 40 according to an embodiment of the present invention, may be remarkably reduced as compared with the apparatus for generating a DBI signal according to the related art. As a result of comparing the area of the apparatus for generating a DBI signal according to an embodiment of the present invention with the area of the apparatus for generating a DBI signal according to the related art on the basis of the number of internal elements provided in the apparatuses, it can be seen that the area of the apparatus for generating a DBI signal according to an embodiment of the present invention may be approximately 52% of the area of the apparatus for generating a DBI signal according to the related art. In addition, as compared with the related art, since the number of lines through which signals are transmitted is reduced, it is easier to improve the degree of integration of the apparatus for generating a DBI signal according to an embodiment of the present invention. Since a large number of apparatuses for generating a DBI signal are provided in the semiconductor integrated circuit, embodiments of the present invention may significantly increase the area margin of the semiconductor integrated circuit.

Further, in view of the power consumed by each of the elements, it can be seen that power consumption of the apparatus for generating a DBI signal according to an embodiment of the present invention that includes a small number of elements may be greatly reduced compared to the related art. That is, embodiments of the present invention may also have an advantage of improving the power efficiency of the semiconductor integrated circuit.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

As described above, the apparatus and method of generating a DBI signal in the semiconductor integrated circuit according to an embodiment of the present invention may reduces the number of elements and lines provided therein to thereby increase the area margin and achieve a high degree of integration.

Further, the apparatus and method of generating a DBI signal in the semiconductor integrated circuit according to an embodiment of the present invention may be driven by using a relatively small number of elements to thereby reduce power consumption and improve power efficiency.

What is claimed is:

1. An apparatus for generating a data bus inversion (DBI) signal in a semiconductor integrated circuit comprising:
    a full adder including data input terminals and a carry input terminal, each of which receives data, and configured to perform an operation on the data, thereby outputting a sum and a carry;
    a half adder including data input terminals, each of which receives data, and configured to perform an operation on the data, thereby outputting a sum and a carry; and
    a DBI determining unit configured to determine a logic value of each of the data on the basis of the sums and the carries that are transmitted from the full adder and the half adder, thereby generating a DBI signal.

2. The apparatus of claim 1,
    wherein the DBI determining unit is configured to enable the DBI signal when the number of data having a first logic value among a plurality of data that are input to the full adder and the half adder is equal to or larger than a predetermined number, and to disable the DBI signal when the number of data having the first logic value is smaller than the predetermined number.

3. An apparatus for generating a data bus inversion (DBI) signal in a semiconductor integrated circuit comprising:
    first and second full adders each of which includes two data input terminals and one carry input terminal, each receiving data and adding the received data, thereby outputting a sum and a carry;
    a half adder including two data input terminals, each of which receives data, and configured to add the received data, thereby outputting a sum and a carry; and
    a DBI determining unit configured to receive the sums and the carries from the first and second full adders and the half adder, and to generate a DBI signal that is enabled when the number of data having a first logic value exceeds half a number of data that are input to the first and second full adders and the half adder.

4. The apparatus of claim 3,
    wherein the DBI determining unit is configured to enable the DBI signal when each of the carries from the first and second full adders and the half adder has the first logic value.

5. The apparatus of claim 3,
    wherein the DBI determining unit is configured to enable the DBI signal when each of the carries from the first and second full adders and the sum output from the half adder has the first logic value.

6. The apparatus of claim 3,
    wherein, if at least one of the sums transmitted from the first and second full adders has the first logic value and at least two of the carries transmitted from the first and second full adders and the half adder have the first logic value, the DBI determining unit is configured to enable the DBI signal.

7. The apparatus of claim 3,
    wherein the DBI determining unit is configured to enable the DBI signal when each of the sums from the first and second full adders and the half adder has the first logic value and at least one of the carries transmitted from the first and second full adders has the first logic value.

8. A method of generating a data bus inversion (DBI) signal in a semiconductor integrated circuit comprising:
    generating a sum and a carry by inputting data to data input terminals and a carry input terminal of a full adder, and generating a sum and a carry by inputting data to data input terminals of a half adder; and
    determining logic values of the data on the basis of the sums and the carries that are generated by the full adder and the half adder, thereby generating a DBI signal.

9. The method of claim 8,
    wherein the generating of the DBI signal enables the DBI signal when a number of data having a first logic value is equal to or larger than a predetermined number among a plurality of data that are input to the full adder and the half adder, and disables the DBI signal when the number of data having the first logic value is smaller than the predetermined number.

10. A method of generating a DBI signal in a semiconductor integrated circuit comprising:
    generating sums and carries by inputting data to two data input terminals and one carry input terminal that are included in each of the first and second full adders, and generating a sum and a carry by inputting data to two data input terminals of a half adder; and
    receiving the sums and the carries that are generated by the first and second full adders and the half adder, and generating a DBI signal that is enabled when a number of data having a first logic value exceeds half the number of data that are input to the first and second full adders and the half adder.

11. The method of claim 10,
wherein the generating of the DBI signal enables the DBI signal when each of the carries that are output from the first and second full adders and the half adder has the first logic value.

12. The method of claim 10,
wherein the generating of the DBI signal enables the DBI signal when all of the carries output from first and second full adders and the sum output from the half adder have the first logic values.

13. The method of claim 10,
wherein, if at least one of the sums that are output from the first and second full adders has the first logic value and at least two of the carries that are output from the first and second full adders and the half adder have the first logic values, the generating of the DBI signal enables the DBI signal.

14. The method of claim 10,
wherein the generating of the DBI signal enables the DBI signal when each of the sums that are output from the first and second full adders and the half adder has the first logic value and at least one of the carries that are output from the first and second full adders has the first logic value.

* * * * *